United States Patent
Lee et al.

(10) Patent No.: US 8,661,294 B2
(45) Date of Patent: Feb. 25, 2014

(54) NONVOLATILE MEMORY DEVICE AND RELATED PROGRAM VERIFICATION CIRCUIT

(75) Inventors: Ji-Sang Lee, Iksan-si (KR); Oh-Suk Kwon, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 464 days.

(21) Appl. No.: 12/975,476

(22) Filed: Dec. 22, 2010

(65) Prior Publication Data

US 2011/0179322 A1 Jul. 21, 2011

(30) Foreign Application Priority Data

Jan. 19, 2010 (KR) .................. 10-2010-0004577

(51) Int. Cl.
    *G06F 11/00* (2006.01)
(52) U.S. Cl.
    USPC ............. 714/38.1; 714/42; 714/718; 714/721
(58) Field of Classification Search
    None
    See application file for complete search history.

(56) References Cited

U.S. PATENT DOCUMENTS

| | | | |
|---|---|---|---|
| 7,352,630 B2* | 4/2008 | Lee et al. | 365/185.22 |
| 7,954,018 B2* | 5/2011 | Ho et al. | 714/718 |
| 8,189,386 B2* | 5/2012 | Park et al. | 365/185.09 |
| 2002/0069381 A1* | 6/2002 | Jeong et al. | 714/704 |
| 2009/0016104 A1* | 1/2009 | Kim | 365/185.03 |
| 2011/0051514 A1* | 3/2011 | Han et al. | 365/185.09 |

FOREIGN PATENT DOCUMENTS

| | | |
|---|---|---|
| JP | 2005018983 A | 1/2005 |
| JP | 2005353242 A | 12/2005 |
| KR | 100648290 B1 | 11/2006 |

* cited by examiner

*Primary Examiner* — Christopher McCarthy
(74) *Attorney, Agent, or Firm* — Volentine & Whitt, PLLC

(57) ABSTRACT

A program verification circuit comprises a failed state counting unit and a failed bit counting unit. The failed state counting unit counts failed program states among a plurality of program states, and generates a first program mode signal indicating whether counting of failed bits is required. The failed bit counting unit selectively counts failed bits in response to the first program mode signal, and generates a second program mode signal indicating whether a program operation is completed.

19 Claims, 10 Drawing Sheets

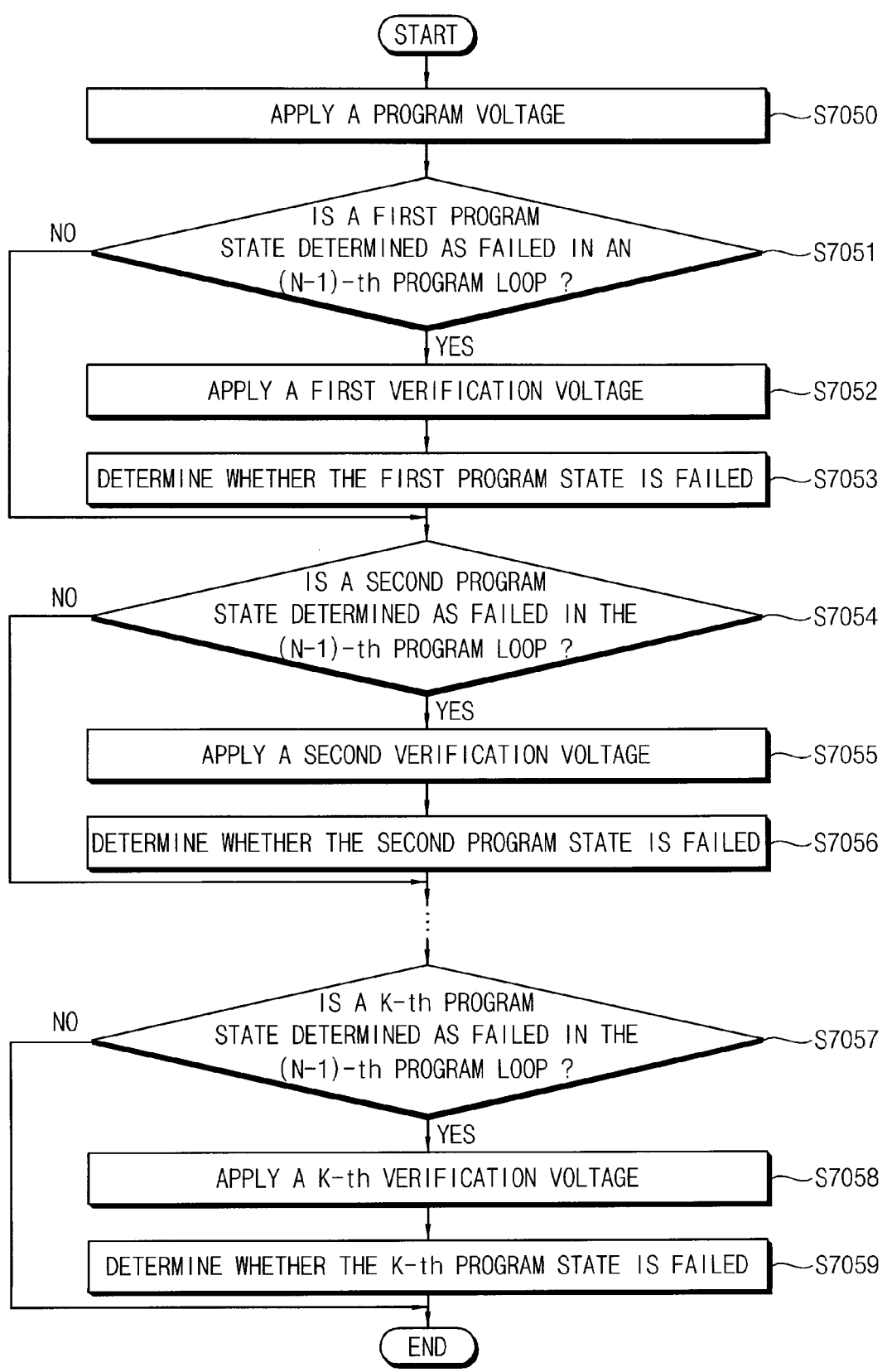

FIG. 9A

|  | VERIFICATION RESULT OF PROGRAM STATES | THE NUMBER OF FAILED BITS |
|---|---|---|
| FIRST PROGRAM STATE | Pass | 0 |
| SECOND PROGRAM STATE | Fail | 3 |
| THIRD PROGRAM STATE | Fail | 4 |
| FOURTH PROGRAM STATE | Fail | 2 |
| FIFTH PROGRAM STATE | Fail | 2 |
| SIXTH PROGRAM STATE | Fail | 2 |
| SEVENTH PROGRAM STATE | Pass | 0 |
| EIGHTH PROGRAM STATE | Fail | 1 |
| SUM | 6 | 14 |

FIG. 9B

|  | VERIFICATION RESULT OF PROGRAM STATES | THE NUMBER OF FAILED BITS |
|---|---|---|
| FIRST PROGRAM STATE | Pass | 0 |
| SECOND PROGRAM STATE | Fail | 3 |
| THIRD PROGRAM STATE | Fail | 4 |
| FOURTH PROGRAM STATE | Pass | 0 |
| FIFTH PROGRAM STATE | Fail | 2 |
| SIXTH PROGRAM STATE | Fail | 2 |
| SEVENTH PROGRAM STATE | Pass | 0 |
| EIGHTH PROGRAM STATE | Pass | 0 |
| SUM | 4 | 11 |

FIG. 9C

| | VERIFICATION RESULT OF PROGRAM STATES | THE NUMBER OF FAILED BITS |
|---|---|---|
| FIRST PROGRAM STATE | Pass | 0 |
| SECOND PROGRAM STATE | Fail | 1 |
| THIRD PROGRAM STATE | Fail | 2 |
| FOURTH PROGRAM STATE | Pass | 0 |
| FIFTH PROGRAM STATE | Pass | 0 |
| SIXTH PROGRAM STATE | Pass | 0 |
| SEVENTH PROGRAM STATE | Pass | 0 |
| EIGHTH PROGRAM STATE | Pass | 0 |
| SUM | 4 | 3 |

NONVOLATILE MEMORY DEVICE AND RELATED PROGRAM VERIFICATION CIRCUIT

CROSS-REFERENCE TO RELATED APPLICATIONS

This application claims priority under 35 U.S.C. §119 to Korean Patent Application No. 10-2010-0004577 filed on Jan. 19, 2010, the disclosure of which is hereby incorporated herein by reference in its entirety.

BACKGROUND

Embodiments of the inventive concept relate generally to semiconductor memory devices. More particularly, embodiments of the inventive concept relate to nonvolatile memory devices and related program verification circuits.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM) and flash memory.

Flash memory devices can be further divided into two categories according to the organization of their array structures. These categories include NAND flash memory devices, which have an array structure that allows memory cells to be accessed in page units, and NOR flash memory devices, which have an array structure that allows memory cells to be accessed in individual bytes. NAND flash memory devices can provide higher storage density than NOR flash memory devices, but they tend to provide slower read times. Accordingly, NAND flash memory devices are commonly used for mass data storage, while NOR flash memory devices are commonly used to store data requiring frequent access, such as application code or data.

Some flash memory devices are designed to store more than one bit of data per memory cell. These flash memory devices are referred to as multi-level cell (MLC) flash memory devices. In an MLC flash memory device, memory cells store multiple bits of data by using multiple threshold voltage distributions to represent different states of multi-bit data. For example a two-bit MLC device uses four threshold voltage distributions to represent respective logical states "11", "10", "01", and "00".

To ensure accurate storage of multi-bit data, the threshold voltage distributions of an MLC flash memory device must be separated by adequate sensing margins. However, as the integration density of flash memory devices continues to increase, the sensing margins tend to decrease as well, which can lead to errors and can increase the time required to perform programming operations.

SUMMARY

Embodiments of the inventive concept provide nonvolatile memory devices and related program verification circuits that can improve the programming speed of the nonvolatile memory devices.

According to one embodiment of the inventive concept, a program verification circuit is configured to verify a program operation in a memory device. The program verification circuit comprises a failed state counting unit configured to count failed program states among a plurality of program states, and configured to generate a first program mode signal indicating whether counting of failed bits is required, and a failed bit counting unit configured to selectively count the failed bits in response to the first program mode signal, and configured to generate a second program mode signal indicating whether the program operation is completed.

In certain embodiments, the failed state counting unit comprises a failed state determiner configured to count the failed program states by determining whether a failed bit exists with respect to each of the plurality of program states, and configured to generate a failed state count signal representing a number of the failed program states, and a first program mode determiner configured to generate the first program mode signal based on the failed state count signal and a number of error-correctable bits.

In certain embodiments, the first program mode determiner activates the first program mode signal where the number of the failed program states is less than or equal to the number of the error-correctable bits. The first program mode determiner deactivates the first program mode signal where the number of the failed program states is greater than the number of the error-correctable bits.

In certain embodiments, the failed bit counting unit comprises a failed bit counter configured to generate a failed bit count signal representing a number of the failed bits in response to the first program mode signal, and a second program mode determiner configured to generate the second program mode signal based on the failed bit count signal and a number of error-correctable bits.

In certain embodiments, the second program mode determiner activates the second program mode signal where the number of the failed bits is less than or equal to the number of error-correctable bits. The second program mode determiner deactivates the second program mode signal where the number of the failed bits is greater than the number of error-correctable bits.

According to another embodiment of the inventive concept, a nonvolatile memory device comprises a memory cell array comprising a plurality of memory cells coupled to a plurality of wordlines and a plurality of bit lines, a page buffer unit configured to temporarily store readout data output from the memory cell array, an error check unit configured to generate an error detection signal indicating one or more errors of the readout data, a program verification circuit configured to count failed program states among a plurality of program states based on the error detection signal, configured to selectively count failed bits according to a number of the failed program states, and configured to generate a program mode signal indicating whether a program operation is finished, and a control unit configured to generate a control signal based on the program mode signal.

In certain embodiments, the program mode signal comprises a first program mode signal and a second program mode signal. The program verification circuit comprises a failed state counting unit configured to count the failed program states, and configured to generate the first program mode signal indicating whether counting of the failed bits is required, and a failed bit counting unit configured to count the failed bits in response to the first program mode signal, and configured to generate the second program mode signal indicating whether the program operation is finished.

In certain embodiments, the failed state counting unit comprises a failed state determiner configured to count the failed program states by determining whether a failed bit exists with respect to each of the plurality of program states, and configured to generate a failed state count signal representing a number of the failed program states, and a first program mode determiner configured to generate the first program mode signal based on the failed state count signal and a number of error-correctable bits.

In certain embodiments, the failed state determiner determines a particular program state among the plurality of program states as failed where at least one failed bit exists in selected memory cells to be programmed to the particular program state.

In certain embodiments, the failed state determiner ignores a program state that has been passed in a previous program loop when counting the failed program states in a current program loop.

In certain embodiments, the first program mode determiner activates the first program mode signal where the number of the failed program states is less than or equal to the number of the error-correctable bits. The first program mode determiner deactivates the first program mode signal where the number of the failed program states is greater than the number of the error-correctable bits.

In certain embodiments, the failed state counting unit generates a program termination signal where the number of the failed program states is zero, and provides the control unit with the program termination signal to finish the program operation.

In certain embodiments, the failed bit counting unit comprises a failed bit counter configured to generate a failed bit count signal representing the number of the failed bits in response to the first program mode signal, and a second program mode determiner configured to generate the second program mode signal based on the failed bit count signal and a number of error-correctable bits.

In certain embodiments, the second program mode determiner activates the second program mode signal where the number of the failed bits is less than or equal to the number of the error-correctable bits. The second program mode determiner deactivates the second program mode signal where the number of the failed bits is greater than the number of the error-correctable bits.

In certain embodiments, the nonvolatile memory device further comprises an error correction unit configured to correct errors in the readout data using an error correction code.

In certain embodiments, the nonvolatile memory device further comprises a loop counter configured to count program loops in response to the program mode signal, and configured to generate a loop count signal representing a number of the program loops.

In certain embodiments, the control unit compares the number of the program loops with a maximum number of the program loops, and terminates the program operation where the number of the program loops exceeds the maximum number.

In certain embodiments, the nonvolatile memory device further comprises a voltage generator configured to generate a program voltage and a pass voltage that are applied to the memory cell array through the plurality of wordlines in response to the control signal.

In certain embodiments, the program voltage comprises incremental step pulses that increase by a step voltage in successive program loops.

In certain embodiments, the plurality of memory cells comprise multi-level cells.

BRIEF DESCRIPTION OF THE DRAWINGS

The drawings illustrate selected embodiments of the inventive concept. In the drawings, like reference numbers indicate like features.

FIG. 8 is a flowchart illustrating a program state verification step in an N-th program loop of the program operation illustrated in FIG. 7.

FIGS. 9A through 9C are diagrams illustrating example verification results obtained in successive program loops of a nonvolatile memory device according to an embodiment of the inventive concept.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, third, etc., are used to describe various features. These terms, however, are not to limit the associated features, but are merely used to distinguish one feature from another. The term "and/or" indicates any and all combinations of one or more of the associated listed items.

Where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. Other words used to describe relationships between features should be interpreted in a similar fashion (e.g., "between" versus "directly between," "adjacent" versus "directly adjacent," etc.).

The terminology used herein is for the purpose of describing example embodiments only and is not intended to limit the scope of the inventive concept. The singular forms "a," "an" and "the" are intended to include the plural forms as well, unless the context clearly indicates otherwise. The terms "comprises" and/or "comprising" indicate the presence of stated features, but they do not preclude additional features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined.

Figure 1:
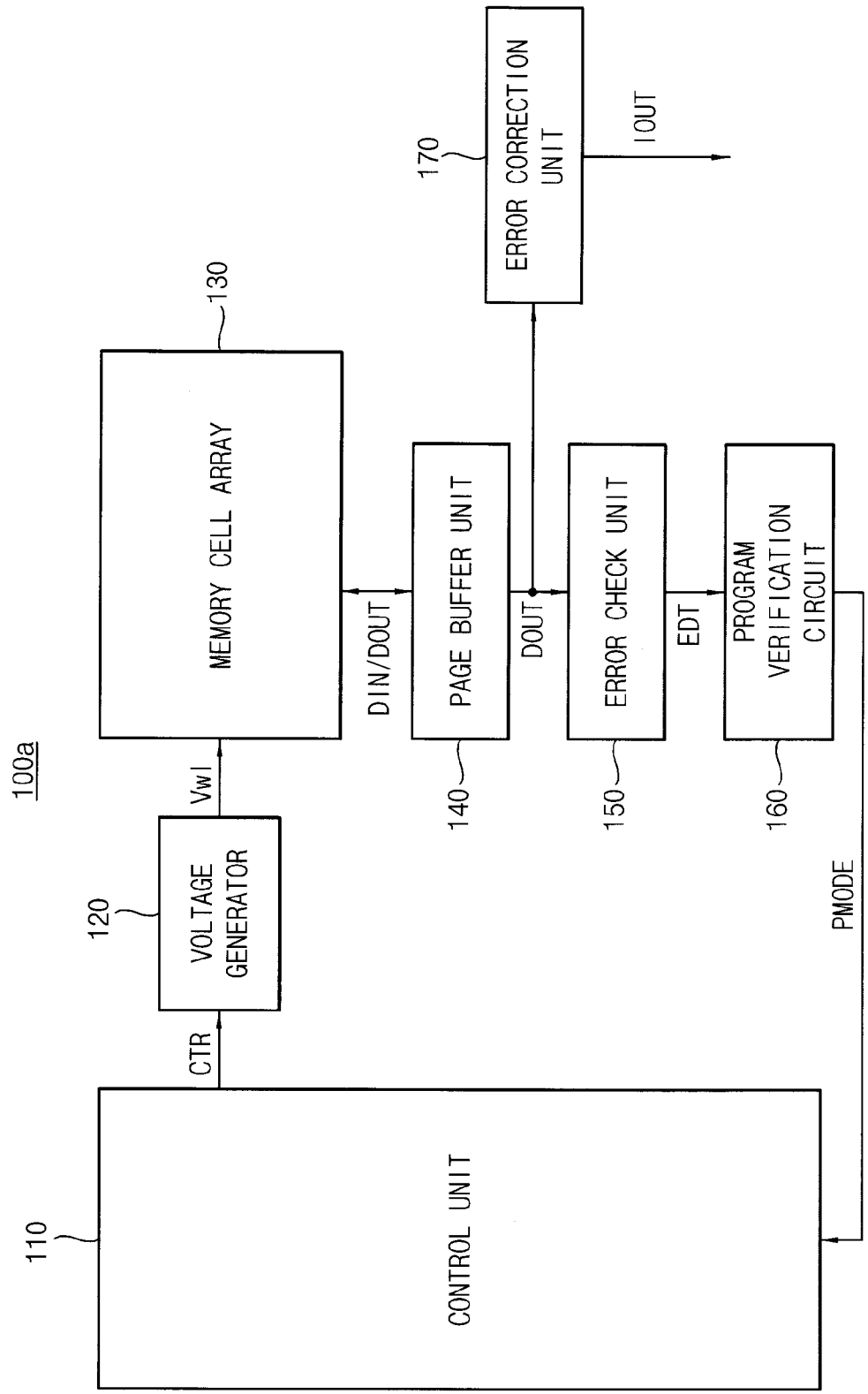
FIG. 1 is a block diagram illustrating a nonvolatile memory device according to an embodiment of the inventive concept.

FIG. 1 is a block diagram illustrating a nonvolatile memory device 100a according to an embodiment of the inventive concept.

Referring to FIG. 1, nonvolatile memory device 100a comprises a control unit 110, a voltage generator 120, a memory cell array 130, a page buffer unit 140, an error check unit 150, a program verification circuit 160, and an error correction unit 170.

Control unit 110 controls a program operation of nonvolatile memory device 100a by generating a control signal CTR. The program operation comprises a plurality of program loops each comprising a program voltage application step and a program verification step. In the program voltage application step, a program voltage is applied to a selected wordline connected to selected memory cells, and a pass voltage is applied to non-selected wordlines connected to non-selected memory cells. In the program verification step, a verification voltage is applied to the selected wordline to determine whether the selected memory cells have been successfully programmed. The program voltage is typically increased in successive program loops.

Voltage generator 120 generates wordline voltages Vw1 to be applied to wordlines of memory cell array 130 based on control signal CTR. Wordline voltages Vw1 typically comprise a read voltage, the verification voltage, the program voltage, and the pass voltage.

Memory cell array 130 stores data in selected memory cells or outputs stored data according to wordline voltages Vw1. Memory cell array 130 comprises a row decoder and a column decoder. The row decoder applies the program voltage to the selected wordline and the pass voltage to the non-selected wordlines in response to a row address provided through an address buffer (not shown). The column decoder performs a column scan operation that outputs readout data DOUT on a column-by-column basis.

Memory cell array 130 comprises a NAND memory cell array. In some embodiments, memory cell array 130 comprises multi-level cells (MLCs) each storing a plurality of bits using a plurality of program states. For instance, in some embodiments, memory cell array 130 comprises MLCs each storing two bits of data using one of four program states corresponding to respective logical states "11", "10", "01", or "00".

Page buffer unit 140 is coupled to memory cell array 130 through bit lines. During the program voltage application step, page buffer unit 140 operates as a write driver to provide data bits through the bit lines according to write data DIN received from control unit 110. During the program verification step or a read operation, page buffer unit 140 operates as a sense amplifier that receives readout data DOUT from memory cell array 130 through the bit lines.

Page buffer unit 140 comprises a plurality of page buffer circuits respectively coupled to the bit lines.

Error check unit 150 receives readout data DOUT from page buffer unit 140 and compares readout data DOUT with write data DIN received from control unit 110. Error check unit 150 generates an error detection signal EDT by comparing readout data DOUT stored in selected memory cells of memory cell array 130 with write data DIN to be programmed in the selected memory cells. Error check unit 150 typically operates in a Y-scan manner to sequentially receive column addresses through a column decoder (not shown) and detect an error by comparing readout data DOUT and write data DIN for each column address.

Program verification circuit 160 receives error detection signal EDT and provides a program mode signal PMODE to control unit 110. Program mode signal PMODE typically comprises a first program mode signal and a second program mode signal. Program verification circuit 160 counts failed program states of the plurality of program states based on error detection signal EDT. A failed program state is a program state to which at least one selected memory cell is designated for programming, but has not yet been successfully programmed. Program verification circuit 160 identifies the failed program states from error detection signal EDT by determining a number of failed bits for selected memory cells to be programmed to each program state. For example, a failed program state can be identified where at least one failed bit exists in a memory cell to be programmed to the program state.

Program verification circuit 160 selectively counts the failed bits based on the number of failed program states. For example, where the number of failed program states is less than or equal to a number of error-correctable bits, program verification circuit 160 counts the failed bits.

Where the counted number of failed bits is less than or equal to the number of error-correctable bits, program verification circuit 160 generates program mode signal PMODE with a state indicating that the program operation is finished. In response to program mode signal PMODE indicating that the program operation is finished, control unit 110 omits subsequent program loops, and completes the program operation.

Where the counted number of failed bits is greater than the number of error-correctable bits, program verification circuit 160 generates program mode signal PMODE with a state indicating that the program operation is not finished. Control unit 110 performs subsequent program loops in response to program mode signal PMODE indicating that the program operation is not finished.

Error correction unit 170 corrects errors of readout data DOUT by using an error correction code during the read operation. The error correction code typically comprises a modified-Hamming code, a Hamming code, or a Reed-Solomon code. The number of error-correctable bits can be varied according to the error correction code used by error correction unit 170. Error correction unit 170 generates output data IOUT by correcting failed bits in readout data DOUT.

Figure 2:
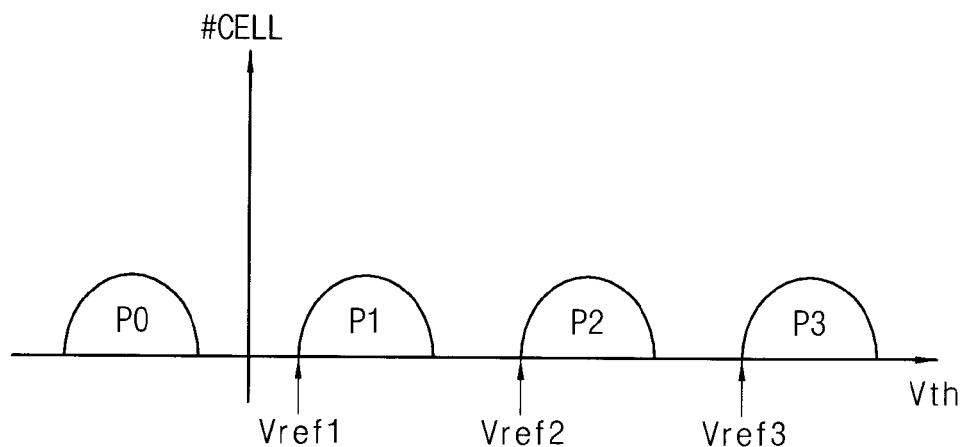
FIG. 2 is a diagram illustrating a plurality of program states of a nonvolatile memory device according to an embodiment of the inventive concept.

FIG. 2 is a diagram illustrating a plurality of program states in a nonvolatile memory device according to an embodiment of the inventive concept. In FIG. 2, the X-axis represents a threshold voltage Vth, and the Y-axis represents a number of memory cells #CELL. In the example of FIG. 2 each memory cell has one of four program states.

Referring to FIG. 2, the plurality of program states comprises first through fourth program states P0, P1, P2, and P3, and each memory cell of a memory cell array stores two bits represented by one of the four program states P0, P1, P2, and P3.

First program state P0 is an erased state in which a memory cell has been erased by an erase operation. The erase operation is typically performed by discharging a charge storing layer by applying a positive high voltage to a substrate or a well region where the memory cell is formed.

A program operation is typically performed by charging the charge storing layer by applying a positive high voltage to a selected wordline. This increases a threshold voltage of a programmed memory cell using the changes stored in the charge storing layer. First through fourth program states P0, P1, P2, and P3 are distinguished by threshold voltages of memory cells, which are determined according to amounts of the charges stored in their charge storing layers.

A program verification step is performed to determine whether memory cells have been successfully programmed to target program states. In the program verification step, a verification voltage is applied to selected memory cells. Where the verification voltage is applied to gates of the memory cells, memory cells having threshold voltages higher than the verification voltage are turned off, and memory cells having threshold voltages lower than the verification voltage are turned on. As an example, the data stored in the memory cells can be verified by sequentially applying first through third verification voltages Vref1, Vref2, and Vref3.

Figure 3:
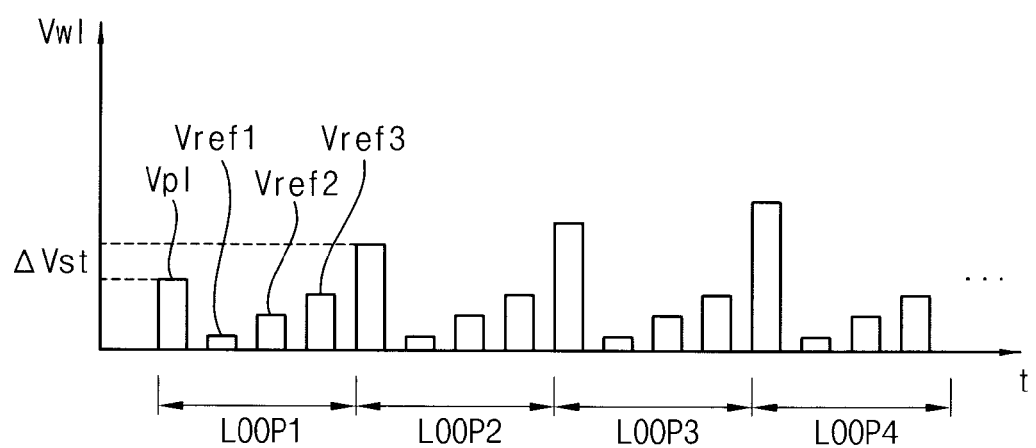
FIG. 3 is a voltage diagram illustrating voltages applied to selected memory cells in successive loops of a program operation according to an embodiment of the inventive concept.

FIG. 3 is a voltage diagram illustrating voltages applied to selected memory cells in successive loops of a program operation according to an embodiment of the inventive concept.

Referring to FIGS. 1 and 3, a program operation comprises a plurality of program loops LOOP1, LOOP2, LOOP3, and LOOP4. In alternative embodiments, the program operation can comprise more or fewer program loops. Each program loop comprises a program voltage application step and a program verification step.

In each program loop, a program voltage Vp1 is applied to wordlines of selected memory cells, and then first through third verification voltages Vref1, Vref2, and Vref3 are sequentially applied to the wordlines of the selected memory cells. In response to the first through third verification voltages Vref1, Vref2, and Vref3, memory cell array 130 outputs readout data DOUT to page buffer unit 140. Error check unit 150 generates an error detection signal EDT by detecting failed bits of respective program states.

Program voltage Vp1 is increased in successive program loops by an increment ΔVst. Because program voltage Vp1 is increased by increment ΔVst, the program operation of FIG. 3 can be referred to as incremental step pulse programming.

Figure 4:
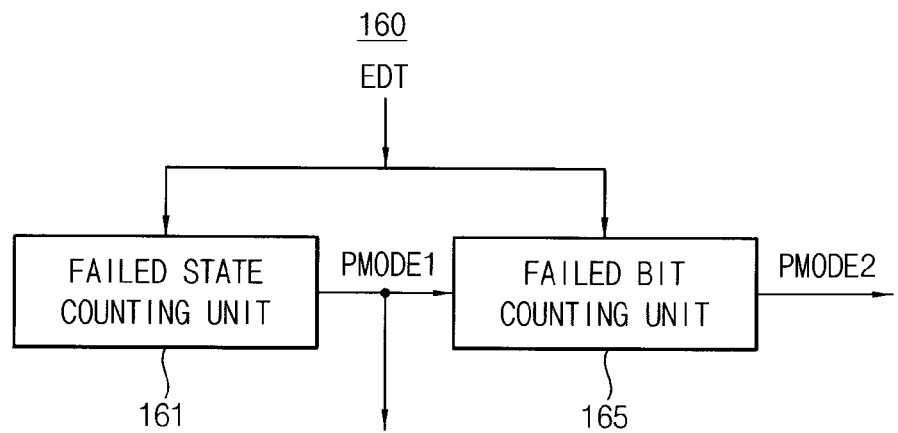
FIG. 4 is a block diagram illustrating a program verification circuit included in a nonvolatile memory device according to an embodiment of the inventive concept.

FIG. 4 is a block diagram illustrating an example of program verification circuit 160 of nonvolatile memory device 100a according to an embodiment of the inventive concept.

Referring to FIG. 4, program verification circuit 160 comprises a failed state counting unit 161 and a failed bit counting unit 165.

Failed state counting unit 161 counts the number of failed states based on error detection signal EDT. Failed state counting unit 161 determines whether respective program states are failed according to the existence of failed bits. For example, a program state can be determined as failed if at least one failed bit exists in memory cells to be programmed to the program state.

Failed state counting unit 161 generates a first program mode signal PMODE1 based on the counted number of the failed program states. First program mode signal PMODE1 indicates whether counting of the failed bits is required. First program mode signal PMODE1 can indicate that counting the failed bits is not required and a subsequent program loop is to be performed, or that the failed bits are to be counted.

Failed state counting unit 161 compares the number of failed states with the number of error-correctable bits. Where the number of failed states is less than or equal to the number of error-correctable bits, failed state counting unit 161 activates first program mode signal PMODE1. First program mode signal PMODE1 can be activated, for instance, by setting it to a logic high level. Otherwise, failed state counting unit 161 deactivates first program mode signal PMODE1. First program mode signal PMODE1 can be deactivated, for instance, by setting it to a logic low level. In response to the deactivation of first program mode signal PMODE1, control unit 110 performs a subsequent program loop.

Failed bit counting unit 165 is activated in response to the activation of first program mode signal PMODE1. Control unit 110 performs the subsequent program loop in response to the deactivation of first program mode signal PMODE1.

In response to the activation of first program mode signal PMODE1, failed bit counting unit 165 counts the failed bits in error detection signal EDT. Failed bit counting unit 165 then generates a second program mode signal PMODE2 by comparing the counted number of failed bits with the number of error-correctable bits.

Where the counted number of failed bits is less than or equal to the number of error-correctable bits, failed bit counting unit 165 activates second program mode signal PMODE2 and provides the activated second program mode signal PMODE2 to control unit 110. Where the counted number of failed bits is less than or equal to the number of error-correctable bits, the subsequent program loop is not performed because the failed bits can be corrected in a read operation using an error correction code. In response to the activation of second program mode signal PMODE2, control unit 110 completes the program operation.

Where the counted number of failed bits is greater than the number of error-correctable bits, failed bit counting unit 165 deactivates second program mode signal PMODE2. In response to the deactivated second program mode signal PMODE2, control unit 110 performs the subsequent program loop.

Figure 5:
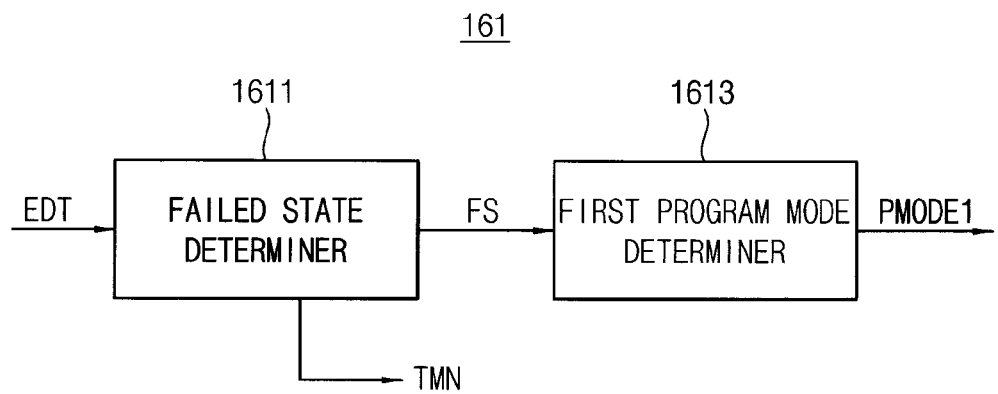
FIG. 5 is a block diagram illustrating a failed state counting unit included in a program verification circuit according to an embodiment of the inventive concept.

FIG. 5 is a block diagram illustrating an example of failed state counting unit 161 of FIG. 4 according to an embodiment of the inventive concept.

Referring to FIG. 5, failed state counting unit 161 comprises a failed state determiner 1611 and a first program mode determiner 1613.

Failed state determiner 1611 generates a failed state count signal FS representing the number of failed program states. Failed state determiner 1611 generates failed state count signal FS by determining whether respective program states are failed according to the existence of failed bits based on error detection signal EDT.

First program mode determiner 1613 generates first program mode signal PMODE1 based on failed state count signal FS and the number of error-correctable bits. First program mode determiner 1613 activates first program mode signal PMODE1 where the number of failed program states is less than or equal to the number of error-correctable bits.

Where the counted number of failed states is greater than the number of error-correctable bits, first program mode determiner 1613 deactivates first program mode signal PMODE1 to perform a subsequent program loop. Where the number of failed program states is less than or equal to the number of error-correctable bits, first program mode determiner 1613 activates first program mode signal PMODE1 to cause failed bit counting unit 165 to count the failed bits.

Where the number of failed program states is zero, first program mode determiner 1613 activates a program termination signal TMN. Control unit 110 completes a program operation in response to the activation of program termination signal TMN.

As indicated by the foregoing, nonvolatile memory device 100a does not count the failed bits of the respective program states in every program loop. Rather, nonvolatile memory device 100a counts the number of failed program states to determine whether to count the failed bits. Where the counted number of failed program states is greater than the number of error-correctable bits, nonvolatile memory device 100a does not count the failed bits, thereby reducing a program verification time.

Figure 6:
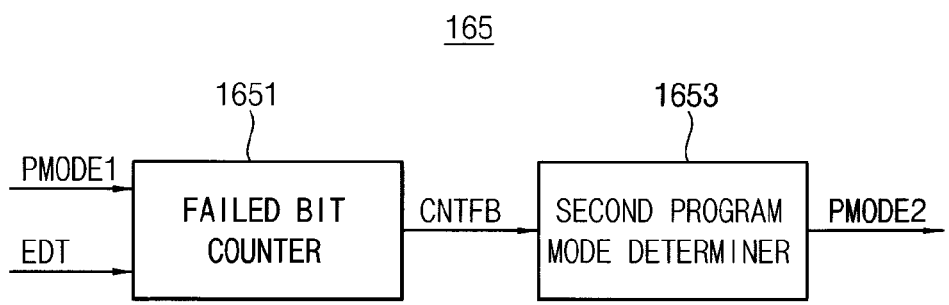
FIG. 6 is a block diagram illustrating a failed bit counting unit included in a program verification circuit according to an embodiment of the inventive concept.

FIG. 6 is a block diagram illustrating an example of failed bit counting unit 165 of FIG. 4 according to an embodiment of the inventive concept.

Referring to FIG. 6, failed bit counting unit 165 comprises a failed bit counter 1651 and a second program mode determiner 1653.

Failed bit counter 1651 counts failed bits in error detection signal EDT in response to first program mode signal PMODE1. The failed bits can be counted per program state, or they can be counted together regardless of their program states. Failed bit counter 1651 provides second program mode determiner 1653 with a failed bit count signal CNTFB representing the counted number of failed bits.

Second program mode determiner 1653 activates second program mode signal PMODE2 where the counted number of failed bits is less than or equal to the number of error-correctable bits. Second program mode determiner 1653 deactivates second program mode signal PMODE2 where the counted number of failed bits is greater than the number of error-correctable bits. Control unit 110 performs a subsequent program loop in response to the deactivation of second program mode signal PMODE2.

Figure 7:
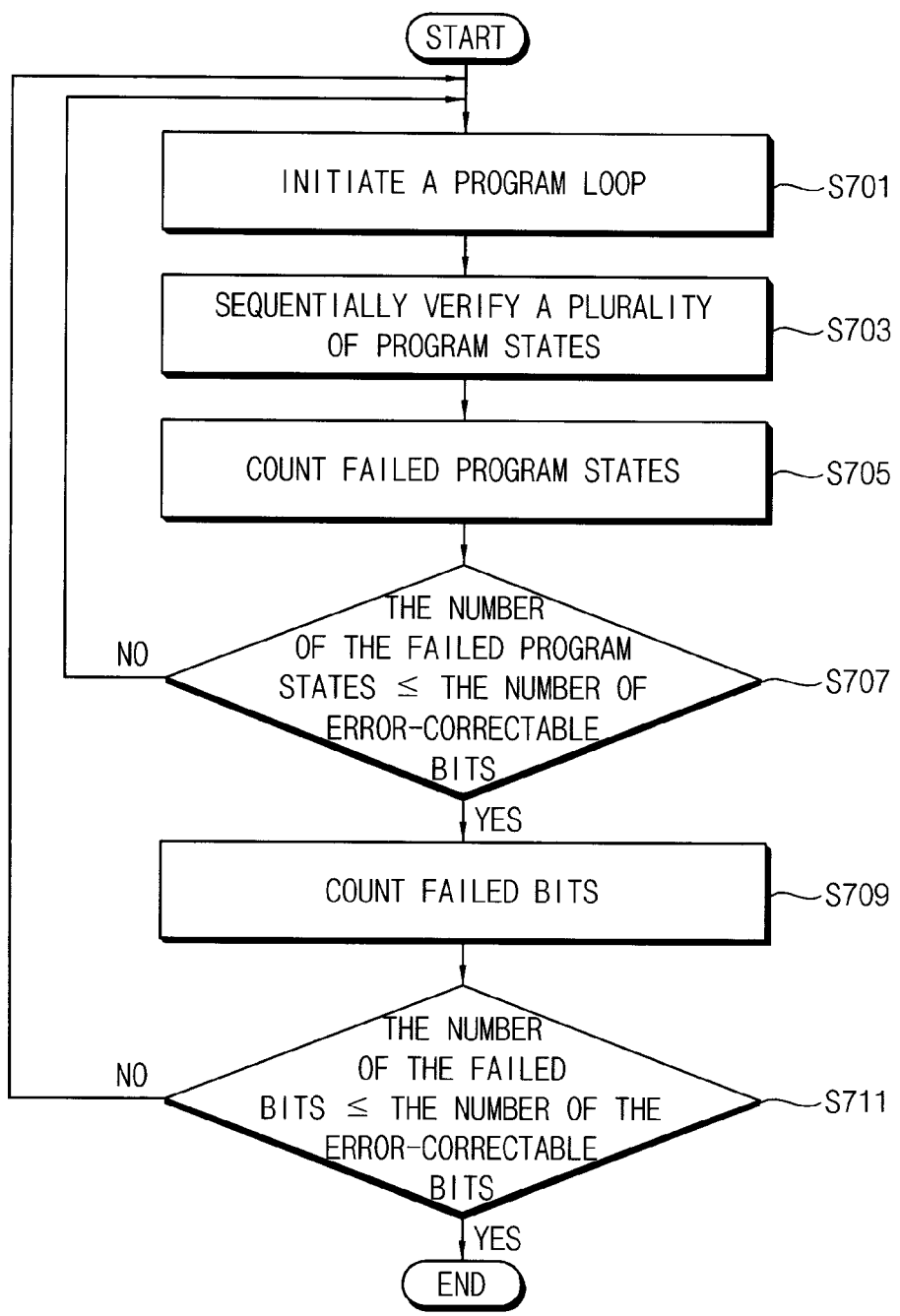
FIG. 7 is a flowchart illustrating a program operation of a nonvolatile memory device according to an embodiment of the inventive concept.

FIG. 7 is a flowchart illustrating a program operation of nonvolatile memory device 110a according to an embodiment of the inventive concept.

Referring to FIGS. 1 through 7, the program operation begins by initiating a program loop comprising a program voltage application step and a program verification step (S701). Next, data is programmed into memory cell array 130 by applying a program voltage to selected memory cells and sequentially verifying whether a plurality of program states have been successfully programmed in the selected memory cells (S703). The verification of the program states can be performed by operating voltage generator 120 to apply a plurality of verification voltages to the selected memory cells in response to a control signal CTR, and receiving, at page buffer unit 140, readout data DOUT stored in the selected memory cells.

Error check unit 150 generates error detection signal EDT by comparing the readout data DOUT with write data DIN. Failed state counting unit 161 determines whether the program states are failed based on error detection signal EDT, and counts failed program states. Because the verification voltages are sequentially applied to the selected memory cells, the program states are sequentially determined as failed or passed. Failed state counting unit 161 counts the failed program states by determining whether at least one failed bit exists in selected memory cells to be programmed to each program state.

Failed state determiner 1611 counts the number of failed program states and generates failed state count signal FS representing the number of failed program states (S705).

First program mode determiner 1613 compares the number of failed program states with the number of error-correctable bits based on the failed state count signal FS and the number of error-correctable bits.

Where the number of failed program states is greater than the number of error-correctable bits (S707=NO), first program mode determiner 1613 deactivates first program mode signal PMODE1, and control unit 110 performs a next program loop in response to the deactivation of first program mode signal PMODE1. Accordingly, where the number of failed program states is greater than the number of error-correctable bits, the failed bits are not counted, and the program operation proceeds to a next program loop. Voltage generator 120 increases the program voltage applied to memory cell array 130 by a step voltage Vst in the next program loop.

Where the number of failed program states is less than or equal to the number of error-correctable bits (S707=YES), first program mode determiner 1613 activates first program mode signal PMODE1. In response to the activated first program mode signal PMODE1, failed bit counting unit 165 counts the failed bits included in error detection signal EDT (S709).

Failed bit counting unit 165 compares the counted number of failed bits with the number of error-correctable bits. Where the counted number of the failed bits is greater than the number of error-correctable bits (S711=NO), failed bit counting unit 165 deactivates second program mode signal PMODE2, and control unit 110 performs the next program loop in response to the deactivation of second program mode signal PMODE2. Where the counted number of failed bits is less than or equal to the number of error-correctable bits (S711=YES), failed bit counting unit 165 activates second program mode signal PMODE2 to complete the program operation.

FIG. 8 is a flowchart illustrating a program state verification step in an N-th program loop of the program operation of FIG. 7.

Referring to FIGS. 1 through 8, wordline voltage Vw1 generated by voltage generator 120 is applied to selected memory cells in memory cell array 130 (S7050). Wordline voltage Vw1 typically comprises a program voltage and a pass voltage. The program voltage increases in successive program loops.

Where a first program state is determined as failed in an (N−1)-th program loop (S7051=YES), first verification voltage Vref1 is applied to the selected memory cells (S7052).

Next, the program state verification step determines whether the first program state is failed by receiving readout data DOUT programmed by the program voltage (S7053). Failed state counting unit 161 determines whether the first program state is failed by receiving error detection signal EDT from error check unit 150 and determining whether at least one failed bit exists in memory cells to be programmed to the first program state. Where at least one failed bit exists, the first program state is determined to be failed.

Where the first program state is determined to be passed in the (N−1)-th program loop (S7051=NO), the first program state is not verified in the N-th program loop, and a next program state (e.g., a second program state) is verified.

Where the second program state is determined to be failed in the (N−1)-th program loop (S7054=YES), the second program state is verified in the N-th program loop by applying a second verification voltage Vref2 to memory cell array 130 (S7055) and determining whether the second program state is failed by receiving readout data DOUT programmed by the program voltage (S7056).

Where the second program state is determined as passed in the (N−1)-th program loop (S7054=NO), the second program state is not verified in the N-th program loop, and a third program state is verified.

Where a K-th program state is determined as failed in the (N−1)-th program loop (S7057=YES), the K-th program state is verified. A K-th verification voltage is applied to memory cell array 130 (S7058), and whether the K-th program state is failed is determined by receiving readout data DOUT programmed by the program voltage (S7059).

Where the K-th program state is determined as passed in the (N−1)-th program loop (S7057=NO), the K-th program state is not verified in the N-th program loop, and the program state verification step in the N-th program loop is finished.

As described above, during the sequential verification of the program states, a nonvolatile memory device does not count failed bits of all program states, but determines whether each program state is failed according to existence of at least one failed bit of the program state. Rather than counting and summing the failed bits of each program state in every program loop, the failed bits are counted only where the number of failed program states is less than or equal to the number of error-correctable bits.

FIGS. 9A through 9C are diagrams illustrating example verification results obtained in successive program loops of a nonvolatile memory device according to an embodiment of the inventive concept. More specifically, FIG. 9A illustrates a verification result of program states and the number of failed bits in an (N−2)-th program loop, FIG. 9B illustrates a verification result of the program states and the number of failed bits in an (N−1)-th program loop, and FIG. 9C illustrates a verification result of the program states and the number of failed bits in an N-th program loop. In the examples of FIGS. 9A through 9C, it is assumed that the number of error-correctable bits is 4.

Referring to FIG. 9A, a first program state and a seventh program state where no failed bit exists are determined as passed, and second through sixth program states and an eighth program state are determined as failed. Because the number of failed program states is 7, the number of failed program states is greater than the number of error-correctable bits. Accordingly, it is determined to perform a subsequent program loop without counting the failed bits. A control unit performs the (N−1)-th program loop in response to deactivated first program mode signal.

Referring to FIG. 9B, the first, fourth, seventh, and eighth program states are determined as passed, and the second, third, fifth, and sixth program states are determined as failed. Because the number of failed program states is 4, the number of failed program states is equal to the number of error-correctable bits.

Failed state counting unit 161 activates first program mode signal PMODE1, and failed bit counting unit 165 counts the failed bits. Because the counted number of failed bits is 11, the counted number of failed bits is greater than the number of error-correctable bits. Consequently, failed bit counting unit 165 deactivates second program mode signal PMODE2, and the control unit performs a subsequent program loop, or the N-th program loop.

Referring to FIG. 9C, the second and third program states are determined as failed. In some embodiments, because the number of failed program states decreases as the program loop is performed, failed state counting unit 161 does not count the number of failed program states, and maintains first program mode signal PMODE1 in the activated state.

Failed bit counting unit 165 counts the failed bits. Because the counted number of failed bits is 3, the counted number of failed bits is less than the number of error-correctable bits. Failed bit counting unit 165 activates second program mode signal PMODE2, and the program operation is finished.

Figure 10:
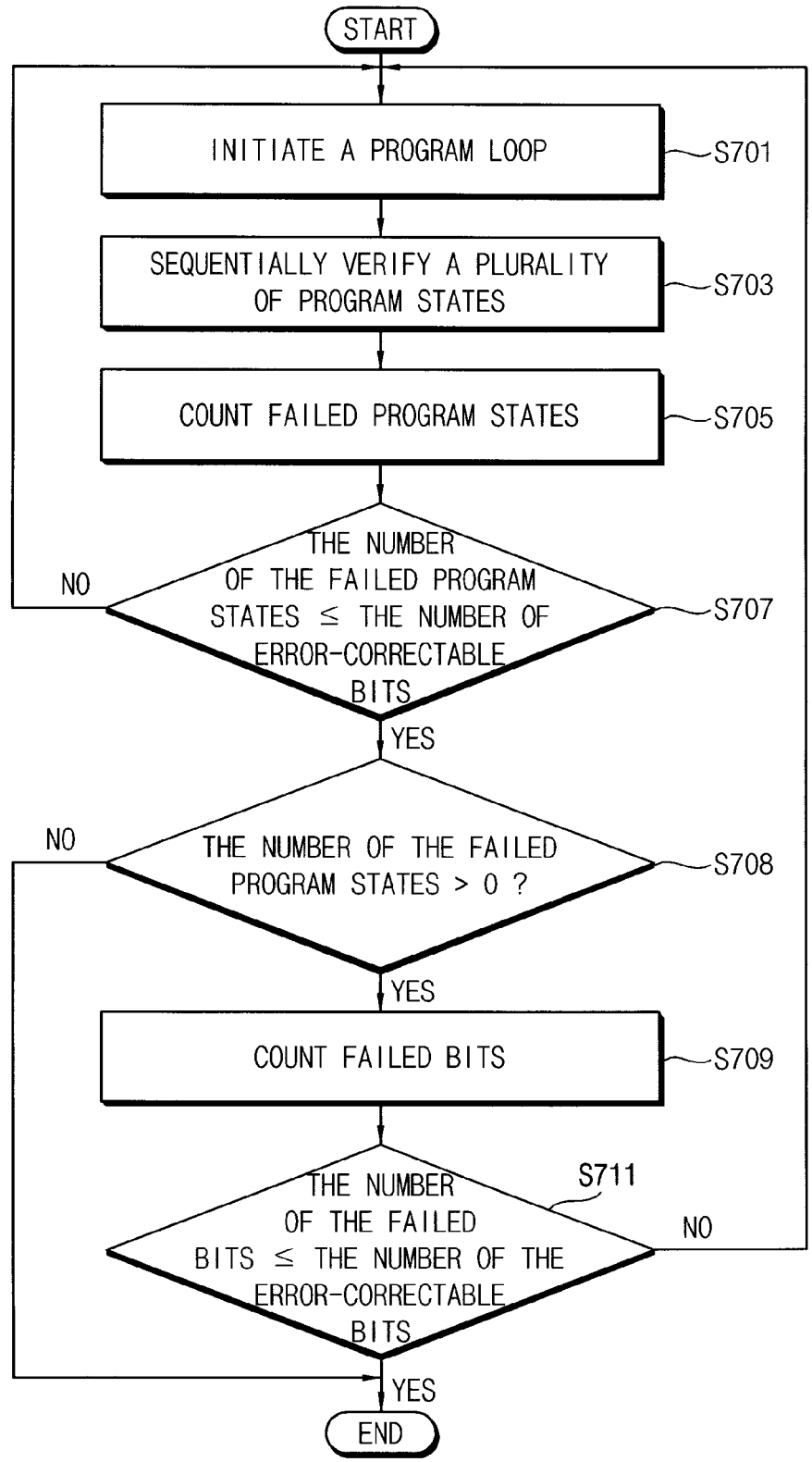
FIG. 10 is a flowchart illustrating a program operation of a nonvolatile memory device according to an embodiment of the inventive concept.

FIG. 10 is a flowchart illustrating a program operation of a nonvolatile memory device according to an embodiment of the inventive concept.

The program operation illustrated in FIG. 10 is similar to the program operation of FIG. 7 except that failed bits are not counted and the program operation is finished once the number of failed program states is 0 (S708=N0). Failed state determiner 1611 or first program mode determiner 1613 activates program termination signal TMN to complete the program operation.

Where the number of failed program states is less than or equal to the number of error-correctable bits, and is greater than 0 (S708=YES), first program mode determiner 1613 activates first program mode signal PMODE1. Failed bit counter 1651 counts the failed bits in response to first program mode signal PMODE1 (S709). For example, first program mode signal PMODE1 can be activated to a logic high level, and failed bit counter 1651 can count the failed bits in response to a rising edge of first program mode signal PMODE1.

Second program mode determiner 1653 compares the counted number of failed bits with the number of error-correctable bits. Where the counted number of failed bits is greater than the number of error-correctable bits (S711=NO), second program mode determiner 1653 deactivates second program mode signal PMODE2 to perform a subsequent program loop.

Where the counted number of failed bits is less than or equal to the number of error-correctable bits (S711=YES), second program mode determiner 1653 activates second program mode signal PMODE2 to finish the program operation.

Figure 11:
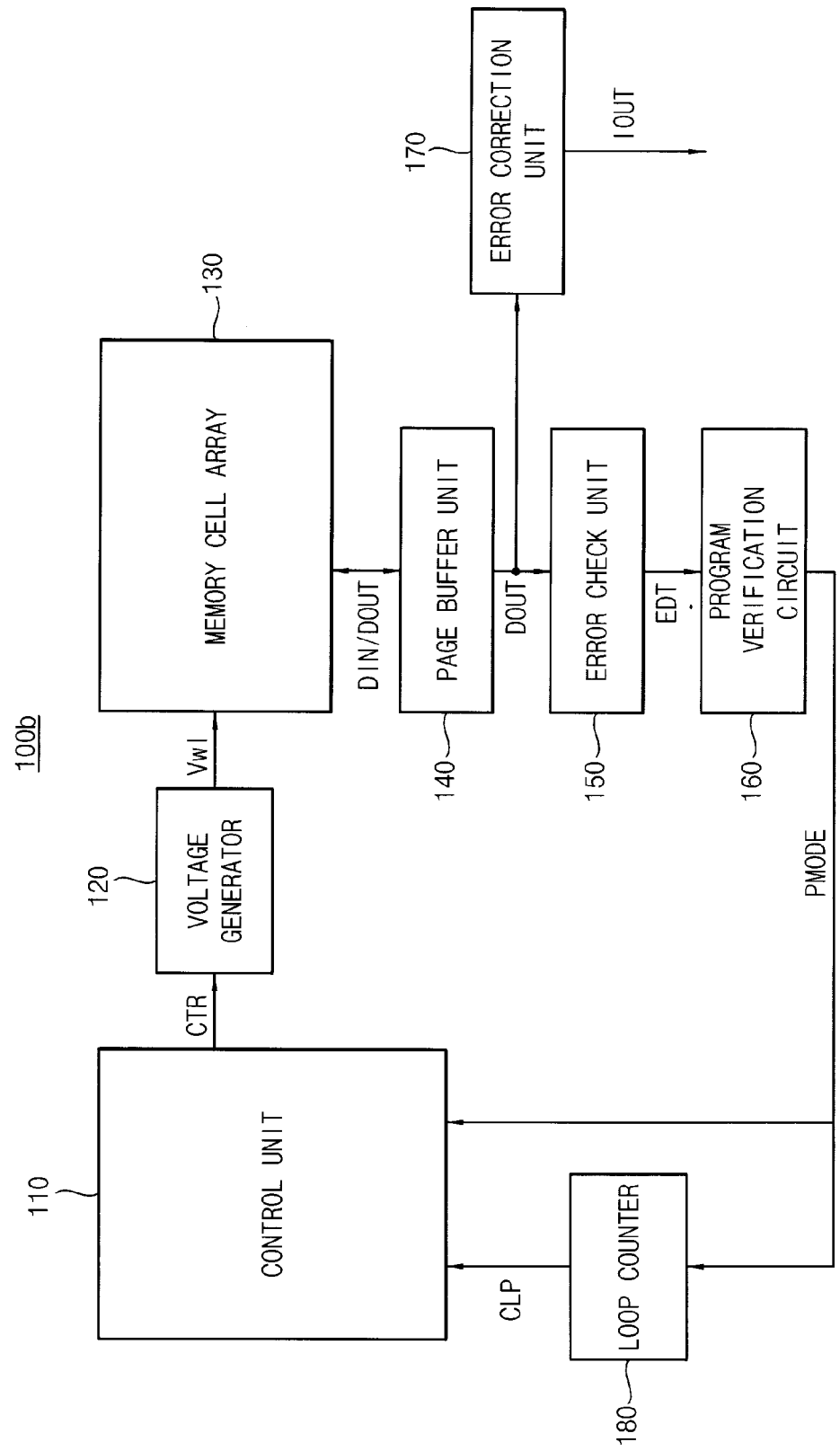
FIG. 11 is a block diagram illustrating a nonvolatile memory device according to an embodiment of the inventive concept.

FIG. 11 is a block diagram illustrating a nonvolatile memory device 100b according to an embodiment of the inventive concept.

Referring to FIG. 11, nonvolatile memory device 100b comprises control unit 110, voltage generator 120, memory cell array 130, page buffer unit 140, error check unit 150, program verification circuit 160, error correction unit 170, and a loop counter 180.

Compared to nonvolatile memory device 100a of FIG. 1, nonvolatile memory device 100b of FIG. 11 further comprises loop counter 180, which counts the number of program loops.

Loop counter 180 generates a loop count signal CLP that represents the number of program loops by counting the number of program loops in response to program mode signal PMODE. In some embodiments, the number of program loops is set to 1 in an initial state.

Control unit 110 generates control signal CTR to perform a subsequent program loop in response to program mode signal PMODE. Program mode signal PMODE comprises first and second program mode signals PMODE1 and PMODE2, and control unit 110 performs the subsequent program loop in response to at least one of first and second program mode signals PMODE1 and PMODE2. For example, control unit 110 can perform the subsequent program loop in response to a falling edge of the at least one of first and second program mode signals PMODE1 and PMODE2.

Control unit 110 stores the maximum number of the program loops that is previously set or provided from an external device. Control unit 110 compares the counted number of program loops represented by loop count signal CLP with the maximum number of program loops, and determines to perform the subsequent program loop based on the comparison. Even where the at least one of first and second program mode signals PMODE1 and PMODE2 is deactivated, control unit 110 can terminate a program operation where the counted number of program loops exceeds the maximum number of program loops. Where the counted number of program loops exceeds the maximum number of program loops, the program operation is determined to be a failure.

Figure 12:
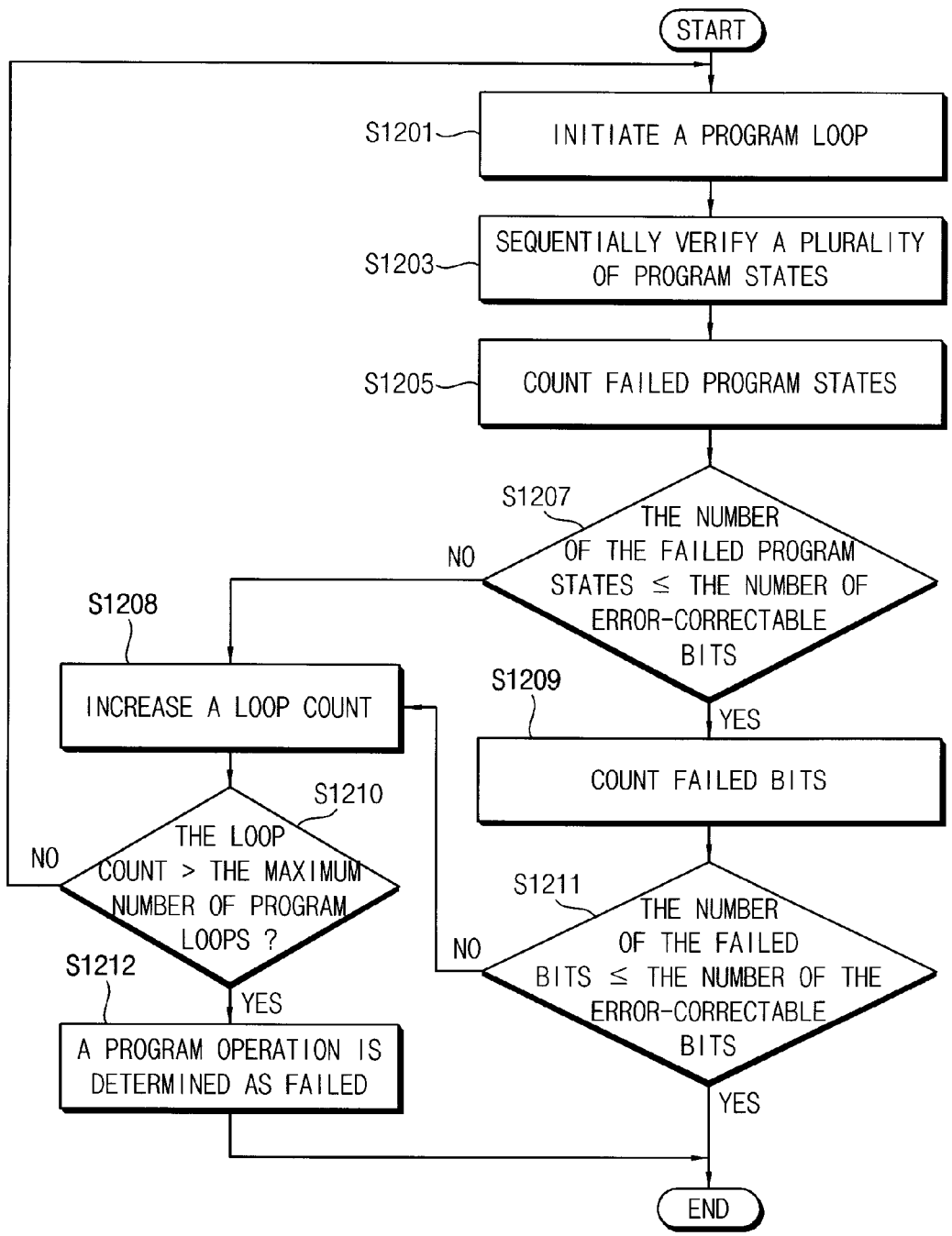
FIG. 12 is a flowchart illustrating a program operation of the nonvolatile memory device of FIG. 11 according to an embodiment of the inventive concept.

FIG. 12 is a flowchart illustrating a program operation of a nonvolatile memory device of FIG. 11 according to an embodiment of the inventive concept.

Referring to FIGS. 11 and 12, a program loop is initiated by a control unit 110 (S1201). The program loop can be initiated in response to program mode signal PMODE.

Data is programmed into memory cell array 130 by applying a program voltage to a selected wordline connected to selected memory cells, and a plurality of program states are sequentially verified (S1203). The verification of the program states is performed by applying a plurality of verification voltages to the selected memory cells in response to a control signal CTR and by receiving, at page buffer unit 140, readout data DOUT stored in memory cell array 130.

Program verification circuit 160 counts the number of failed program states (S1205). Where at least one failed bit exists with respect to a program state, the program state is determined to be failed. Program verification circuit 160 compares the counted number of failed program states with the number of error-correctable bits. The number of error-correctable bits can be set to a predetermined value, or can be determined according to an error correction code used in error correction unit 170.

Where the number of failed program states is greater than the number of error-correctable bits (S1207=NO), first program mode signal PMODE1 is deactivated and provided to loop counter 180. Then, loop counter 180 increases a loop count by 1 (S1208). Control unit 110 compares the loop count with the predetermined maximum number of program loops. Where the current loop count is less than or equal to the maximum number of program loops (S1210=NO), a subsequent program loop is performed.

Where the current loop count is greater than the maximum number of program loops (S1210=YES), the program operation is determined to be a failure (S1212), and the program operation is terminated.

Where the number of failed program states is less than or equal to the number of error-correctable bits (S1207=YES), program verification circuit 160 counts the failed bits (S1209).

Where the counted number of failed bits is greater than the number of error-correctable bits (S1211=NO), program verification circuit 160 deactivates second program mode signal PMODE2 and provides second program mode signal PMODE2 to control unit 110 and loop counter 180.

Then, loop counter 180 increases the loop count by 1 (S1208). Control unit 110 compares the loop count with the predetermined maximum number of program loops. Where the current loop count is less than or equal to the maximum number of program loops (S1210=NO), the subsequent program loop is performed.

Where the current loop count is greater than the maximum number of program loops (S1210=YES), the program operation is determined to be a failure (S1212), and the program operation is terminated.

Where the counted number of failed bits is less than or equal to the number of error-correctable bits (S1211=YES), program verification circuit 160 activates the second program mode signal to finish the program operation.

The above-described nonvolatile memory devices can be packaged in various configurations, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). Moreover, the above-described nonvolatile memory devices can be incorporated in various types of computing systems.

As indicated by the foregoing, a program verification circuit can reduce the time and power required to perform program operations in a nonvolatile memory device by counting failed bits only upon determining that a number of failed states is less than or equal to a number of error-correctable bits.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A program verification circuit configured to verify a program operation in a memory device, comprising:
a failed state counting unit configured to count failed program states among a plurality of program states for output data, and configured to generate one of an activated first program mode signal when at least one failed bit exists in the output data, and a deactivated first program mode signal when no failed bit exists in the output data, wherein the deactivated first program mode signal terminates the program operation; and
a failed bit counting unit configured to count the at least one failed bit in response to the activated first program mode signal, and configured to generate one of an activated second program mode signal when the program operation is completed and a deactivated second program mode signal when a next program loop of the program operation is to be executed.

2. The program verification circuit of claim 1, wherein the failed state counting unit comprises:
a failed state determiner configured to count the failed program states by determining whether a failed bit exists with respect to each one of the plurality of program states, and configured to generate a failed state count signal representing a number of the failed program states; and
a first program mode determiner configured to generate the one of the activated first program mode signal and the deactivated first program mode signal by comparing the failed state count signal with a number of error-correctable bits capable of being provided by an error correction unit operating on the output data.

3. The program verification circuit of claim 2, wherein the first program mode determiner generates the activated first program mode signal when the number of the failed program states is less than or equal to the number of the error-correctable bits, and generates the deactivated first program mode signal when the number of the failed program states is greater than the number of the error-correctable bits.

4. The program verification circuit of claim 1, wherein the failed bit counting unit comprises:
a failed bit counter operating in response to the activated first program mode signal and configured to generate a failed bit count signal representing a number of the failed bits in the output data; and a second program mode determiner configured to generate the one of the activated second program mode signal and the deactivated second program mode signal based on the failed bit count signal and a number of error-correctable bits capable of being provided by an error correction unit operating on the output data.

5. The program verification circuit of claim 4, wherein the second program mode determiner generates the activated second program mode signal when the number of the failed bits is less than or equal to the number of error-correctable bits, and generates the deactivated second program mode signal when the number of the failed bits is greater than the number of error-correctable bits.

6. A nonvolatile memory device, comprising:
  a memory cell array comprising a plurality of memory cells coupled to a plurality of wordlines and a plurality of bit lines;
  a page buffer unit that temporarily stores output data read from the memory cell array;
  an error check unit that generates an error detection signal;
  a program verification circuit comprising;
    a failed state counting unit configured to count failed program states among a plurality of program states for the output data, and generate one of an activated first program mode signal when the least one error is indicated in the output data and a deactivated first program mode signal when no error is indicated in the output data, and
    a failed bit counting unit configured to count the at least one error in response to the activated first program mode signal, and generate one of an activated second program mode signal when the program operation is completed and a deactivated second program mode signal when a next program loop of the program operation is to be executed;
  and
  a control unit operating in response to the second program mode signal to terminate execution of the program operation or continue execution of the program operation.

7. The nonvolatile memory device of claim 6, wherein the failed state counting unit comprises:
  a failed state determiner configured to count the failed program states by determining whether an error exists in the output data with respect to each one of the plurality of program states, and configured to generate a failed state count signal representing a number of the failed program states; and
  a first program mode determiner configured to generate the one of the activated first program mode signal and the deactivated first program signal by comparing the failed state count signal with a number of error-correctable bits capable of being provided by an error correction unit operating on the output data.

8. The nonvolatile memory device of claim 7, wherein the failed state determiner determines a particular program state among the plurality of program states as failed when at least one error in the output data exists in relation to the particular program state.

9. The nonvolatile memory device of claim 7, wherein the failed state determiner is further configured to ignore a program state that has been passed during a previous program loop of the program operation when counting the failed program states during a current program loop of the program operation.

10. The nonvolatile memory device of claim 7, wherein the first program mode determiner generates the activated first program mode signal when the number of the failed program states is less than or equal to the number of the error-correctable bits, and generates the deactivated first program mode signal when the number of the failed program states is greater than the number of the error-correctable bits.

11. The nonvolatile memory device of claim 6, wherein the failed state counting unit is further configured to generate a program termination signal provided to the control unit when the number of the failed program states is zero, and the control unit is configured to terminate execution of the program operation in response to the program termination signal.

12. The nonvolatile memory device of claim 6, wherein the failed bit counting unit comprises:
  a failed bit counter operating in response to the activated first program mode signal and configured to generate a failed bit count signal representing a number of errors in the output data; and
  a second program mode determiner configured to generate the one of the activated second program mode signal and the deactivated second program mode signal based on the failed bit count signal and a number of error-correctable bits capable of being provided by an error correction unit operating on the output data.

13. The nonvolatile memory device of claim 12, wherein the second program mode determiner generates the activated second program mode signal when the number of errors in the output data is less than or equal to the number of error-correctable bits, and generates the deactivated second program mode signal when the number of errors in the output data is greater than the number of error-correctable bits.

14. The nonvolatile memory device of claim 6, further comprising:
  an error correction unit the operates on the output data to provide a number of correctable bits for errors detected in the output data.

15. The nonvolatile memory device of claim 6, further comprising:
  a loop counter configured to count program loops in response to at least the second program mode signal, and configured to generate a loop count signal representing a number of the program loops.

16. The nonvolatile memory device of claim 15, wherein the control unit compares the number of the program loops with a maximum number of the program loops, and terminates the program operation when the number of the program loops exceeds the maximum number.

17. The nonvolatile memory device of claim 6, further comprising:
  a voltage generator configured to generate a program voltage and a pass voltage that are applied to the memory cell array through the plurality of wordlines in response to the control signal.

18. The nonvolatile memory device of claim 17, wherein the program voltage comprises incremental step pulses that increase by a step voltage in successive program loops.

19. The nonvolatile memory device 6, wherein the plurality of memory cells comprise multi-level cells.

* * * * *